US011264425B2

(12) United States Patent
Ouvrier-Buffet et al.

(10) Patent No.: US 11,264,425 B2
(45) Date of Patent: Mar. 1, 2022

(54) PROCESS FOR FABRICATING AN ARRAY OF GERMANIUM-BASED DIODES WITH LOW DARK CURRENT

(71) Applicant: Commissariat A L'Energie Atomique et aux Energies Alternatives, Paris (FR)

(72) Inventors: Jean-Louis Ouvrier-Buffet, Grenoble (FR); Abdelkader Aliane, Grenoble (FR); Jean-Michel Hartmann, Grenoble (FR); Julie Widiez, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 53 days.

(21) Appl. No.: 16/695,265

(22) Filed: Nov. 26, 2019

(65) Prior Publication Data
US 2020/0176503 A1 Jun. 4, 2020

(30) Foreign Application Priority Data
Nov. 30, 2018 (FR) ...................................... 18 72106

(51) Int. Cl.
*H01L 27/146* (2006.01)
*H01L 21/02* (2006.01)

(52) U.S. Cl.
CPC .... *H01L 27/14645* (2013.01); *H01L 21/0257* (2013.01); *H01L 21/02532* (2013.01); *H01L 27/14698* (2013.01)

(58) Field of Classification Search
CPC . H01L 27/146; H01L 21/02; H01L 27/14645; H01L 21/02532; H01L 21/0257; H01L 27/14698; H01L 27/14638; H01L 31/103; H01L 31/035272; H01L 31/02327
See application file for complete search history.

(56) References Cited

U.S. PATENT DOCUMENTS 7,397,101 B1 * 7/2008 Masini ................. H01L 31/028
257/184
9,659,989 B1 * 5/2017 Ai ..................... H01L 21/76237
(Continued)

FOREIGN PATENT DOCUMENTS

CN            107871800 A      4/2018

OTHER PUBLICATIONS

French Preliminary Search Report dated Sep. 16, 2019 in French Application 18 72106 filed on Nov. 30, 2018 (with English Translation of Categories of Cited Documents & Written Opinion).

*Primary Examiner* — Sheng-Bai Zhu
(74) *Attorney, Agent, or Firm* — Oblon, McClelland, Maier & Neustadt, L.L.P.

(57) ABSTRACT

A process for fabricating an optoelectronic device including an array of germanium-based photodiodes including the following steps: producing a stack of semiconductor layers, made from germanium; producing trenches; depositing a passivation intrinsic semiconductor layer, made from silicon; annealing, ensuring, for each photodiode, an interdiffusion of the silicon of the passivation semiconductor layer and of the germanium of a semiconductor portion, thus forming a peripheral zone of the semiconductor portion, made from silicon-germanium.

12 Claims, 5 Drawing Sheets

(56) References Cited

U.S. PATENT DOCUMENTS

2007/0170536 A1* 7/2007 Hsu .................... H01L 31/1055
257/458
2011/0272561 A1 11/2011 Sanfilippo et al.
2017/0012143 A1 1/2017 Usami et al.

* cited by examiner

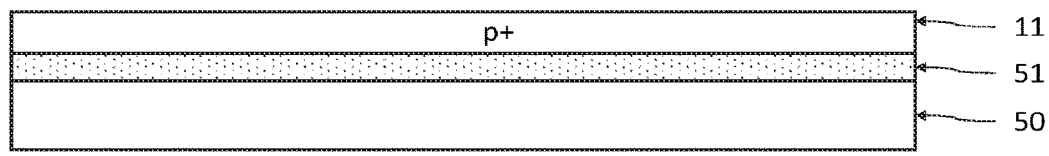
Fig.2A
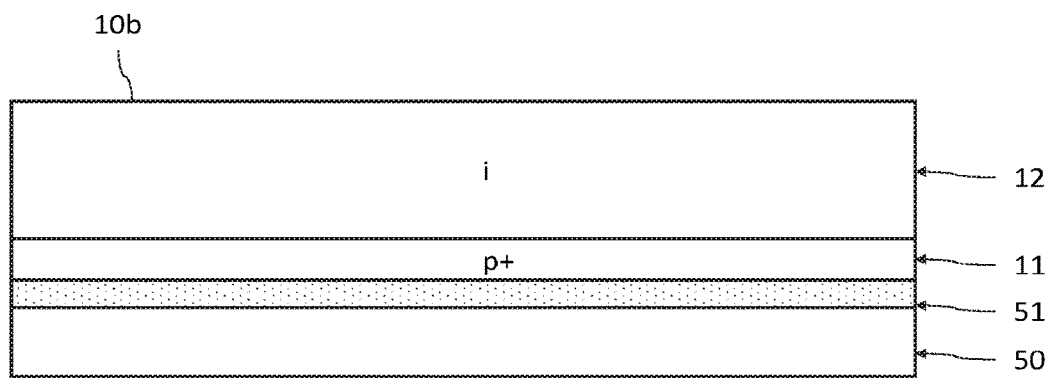
Fig.2B
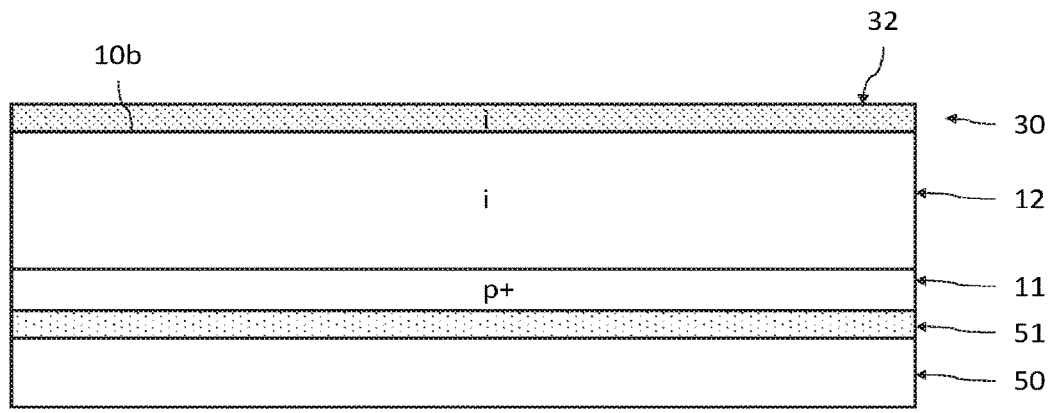
Fig.2C
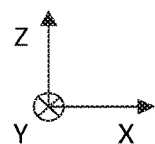

PROCESS FOR FABRICATING AN ARRAY OF GERMANIUM-BASED DIODES WITH LOW DARK CURRENT

TECHNICAL FIELD

The field of the invention is that of photodiodes made from germanium. The invention finds an application notably in the field of detecting light radiation belonging to the short wavelength infrared range.

PRIOR ART

Germanium-based photodiodes are suitable for detecting light radiation in the short wavelength infrared (SWIR). The use thereof is advantageous notably when it is a question of detecting the presence of chemical elements, the spectral signature of which is located in the SWIR range. These may thus be water, lipids, chemical elements present in biological tissues, etc. They are also used in the telecommunications field, and also in the datacom field.

Germanium-based photodiodes customarily have a mesa structure, in which the diodes are produced from a stack of semiconductor layers including a p-doped lower layer resting on a growth substrate, an intrinsic intermediate layer, and an n-doped upper layer. The pixelation between the photodiodes is obtained by localized etching, so that the lateral edge of each photodiode can then be defined by each of the semiconductor layers. The upper face of the n-doped layer and the lateral edge are then coated with a passivation layer made of dielectric material, for example a silicon oxide. Since the structure is of mesa type, the dielectric passivation layer extends in a three-dimensional manner so as to cover the photodiode, and not in an essentially planar manner.

There is a constant need to have a small-pitch photodiode array, having a fill factor greater than in the case of mesa photodiodes, the fill factor being defined as the ratio of the detection surface area to the total surface area of the photodiode. It is then important to ensure a good passivation of the upper face and of the lateral edge of the photodiodes, to the extent that the surface component of the dark current can then become predominant.

However, it appears that the presence of the dielectric passivation layer may despite everything contribute to generating a sizeable dark current. In this regard, the article by Sood et al. entitled 'Characterization of SiGe-Detector Arrays for Visible-NIR Imaging Sensor Applications', *Proc. of SPIE*, vol. 8012, 801240, 2011, describes a process for fabricating a photodiode that makes it possible to limit the dark current. The dark current is linked to the presence of a depleted zone located in the semiconductor material of the photodiode, at the interface with the dielectric passivation layer. The fabrication process then comprises a step of annealing the photodiode under $N_2H_2$, making it possible to transform this depleted zone into a hole accumulation zone. It appears that this step makes it possible to reduce the intensity of the dark current.

However, this annealing step, intended to change the depleted zone into an accumulation zone, may lead to a degradation of the photodiode performance, notably owing to an undesired modification of the dimensions of the n-doped layer, to the extent that the diffusion coefficient of the n-type dopant elements in the germanium (e.g. phosphorus) may be sizeable. Furthermore, the presence and the characteristics of the depleted zone may be linked to the technique used to deposit the dielectric passivation layer and also to the operating conditions. As a result, the annealing in question may then not make it possible to reproducibly obtain the desired accumulation zone and therefore the desired reduction of the dark current.

SUMMARY OF THE INVENTION

The objective of the invention is to at least partly overcome the drawbacks of the prior art, and more particularly to propose a process for fabricating an array of germanium-based planar photodiodes, thus having a high fill factor, and making it possible to obtain a low dark current while maintaining the properties of the photodiode(s) and in particular the dimensions of the n-doped region(s).

For this, one subject of the invention is a process for fabricating an optoelectronic device comprising an array of planar photodiodes made from germanium, comprising the following steps:

i) producing a stack of semiconductor layers, made from germanium, having a first face and a second face that are opposite one another and are parallel to a main plane of the photodiodes, and comprising:
  a p-doped first layer, defining the first face, and
  a second layer, covering the first layer, and defining the second face;

ii) producing trenches, extending through said stack from the second face in the direction of the first face, defining for each photodiode a semiconductor portion of said stack;

iii) depositing a passivation intrinsic semiconductor layer, made from silicon, covering the second face and filling the trenches; and iv) annealing, ensuring, for each photodiode, an interdiffusion of the silicon of the passivation semiconductor layer and of the germanium of the semiconductor portion, thus forming what is referred to as a peripheral zone of the semiconductor portion, made from silicon-germanium, and located in contact with the passivation semiconductor layer.

Certain preferred but nonlimiting aspects of this fabrication process are the following.

The process may comprise, following the interdiffusion annealing step, a step of producing, for each photodiode, what is referred to as an n-doped upper region of the semiconductor portion, flush with the second face and located at a distance from a lateral edge of the semiconductor portion connecting the first and second faces to one another, via the following substeps:

localized ion implantation of n-type dopant elements in what is referred to as a central portion of the passivation semiconductor layer, and
  annealing, ensuring a diffusion of the n-type dopant elements from the central portion to the semiconductor portion, thus forming the n-doped upper region.

The process may comprise a step of doping so-called lateral parts of the passivation semiconductor layer, that are located in the trenches, by localized ion implantation of p-type dopant elements, thus forming, for each photodiode, a p-doped lateral part, followed by a step of annealing ensuring the diffusion of the p-type dopant elements from the lateral parts to the semiconductor portions, thus forming, in each semiconductor portion, what is referred to as a p-doped lateral region flush with a lateral edge of the semiconductor portion.

The step of diffusion annealing of the p-type dopant elements is carried out before or during the step of diffusion annealing of the n-type dopant elements.

The process may comprise a step of producing an electrical interconnection layer, comprising:

depositing an upper insulating layer made of a dielectric material, covering the passivation semiconductor layer, then forming, through the upper insulating layer, conductive portions, that come into contact, for each photodiode, with what is referred to as a p-doped lateral part of the passivation semiconductor layer located in a trench on the one hand, and with what is referred to as an n-doped central portion of the passivation semiconductor layer located on the second face and in contact with what is referred to as an n-doped upper region of the semiconductor portion.

The invention also relates to an optoelectronic device comprising an array of planar photodiodes made from germanium, having a first face and a second face that are opposite one another and are parallel to a main plane of the photodiodes, each photodiode comprising:

a semiconductor portion, comprising:
what is referred to as a p-doped lower first region flush with the first face,
what is referred to as an n-doped upper second region flush with the second face, and
an intermediate region located between the first and second regions and surrounding the second region in the main plane;

a trench, extending from the second face in the direction of the first face, and defining a lateral edge of the semiconductor portion connecting the first and second faces;

a passivation semiconductor layer, made from silicon, covering the second face and filling the trench; and what is referred to as a peripheral zone made from silicon-germanium, located in the semiconductor portion in contact with the passivation semiconductor layer at the second face and at the lateral edge.

The passivation semiconductor layer may comprise what is referred to as an upper part extending in contact with the second face, and what is referred to as a lateral part filling the trenches and extending in contact with the lateral edge, the upper part comprising what is referred to as an n-doped central portion located in contact with the n-doped second region, and what is referred to as a peripheral portion, surrounding the central portion in the main plane.

The lateral part may be p-doped, and be in contact with the p-doped first region.

Each semiconductor portion may comprise what is referred to as a p-doped lateral region located in contact with the p-doped lateral part.

The optoelectronic device may comprise a control chip suitable for biasing the photodiodes, assembled and electrically connected to the array of photodiodes at the second face.

BRIEF DESCRIPTION OF THE DRAWINGS

Other aspects, objectives, advantages and features of the invention will become more clearly apparent upon reading the following detailed description of preferred embodiments thereof, which description is provided by way of non-limiting example and with reference to the appended drawings, in which:

FIGS. 2A to 2L illustrate, schematically and partially, various steps of a process for fabricating an array of photodiodes according to the embodiment illustrated in FIG. 1.

DETAILED DESCRIPTION OF PARTICULAR EMBODIMENTS

Figure 1:
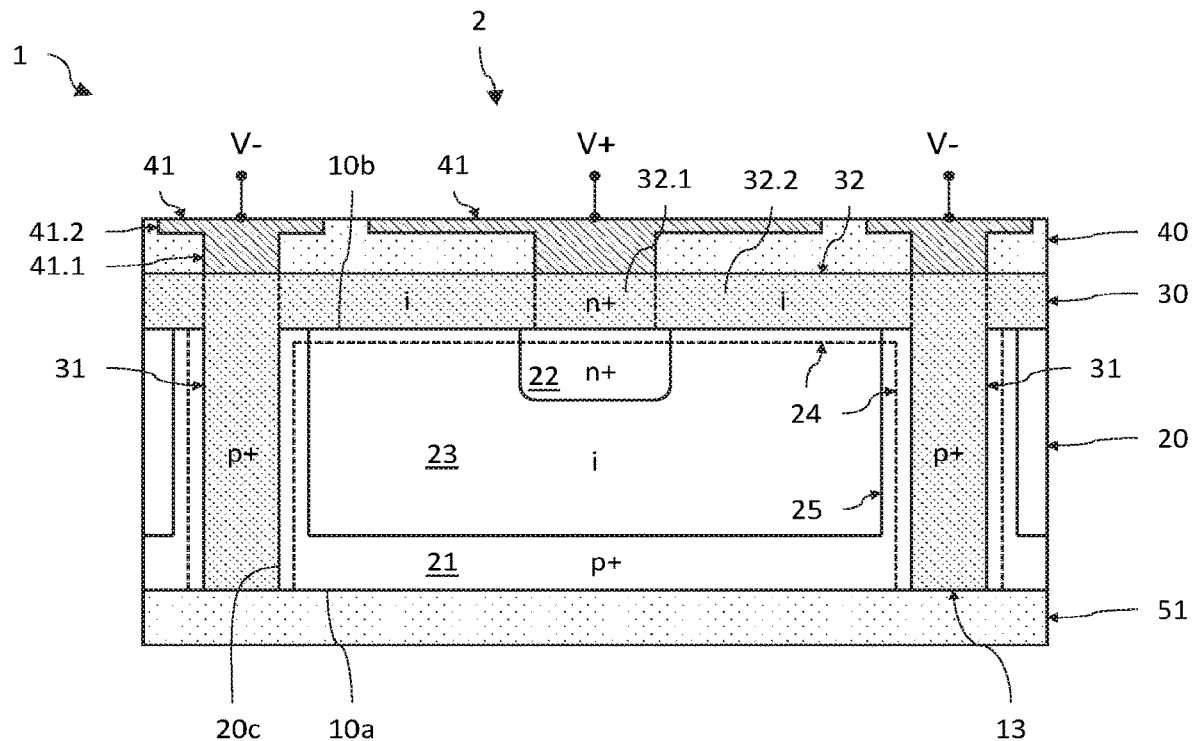
FIG. 1 is a schematic and partial view, in cross section, of a photodiode of an array of planar photodiodes according to one embodiment.
Figure 1:
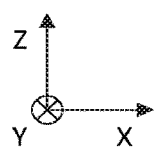
Figure 2D:
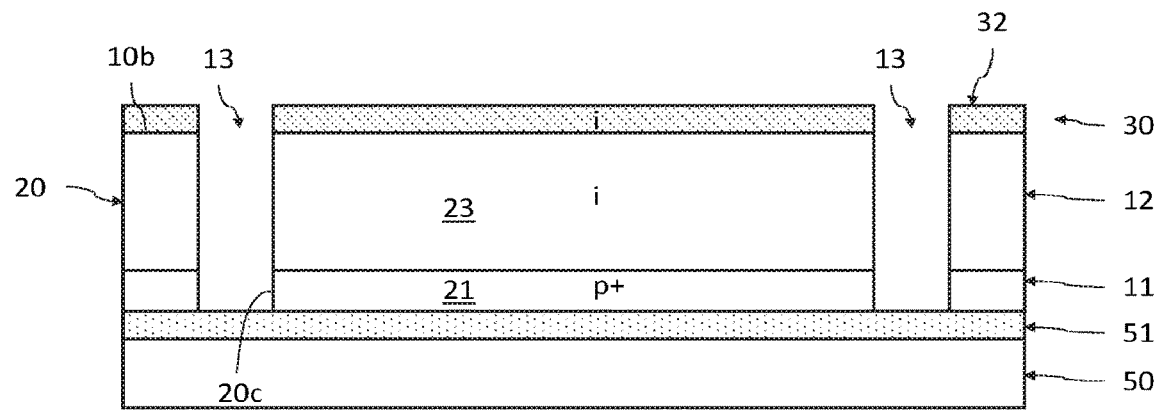
Figure 2E:
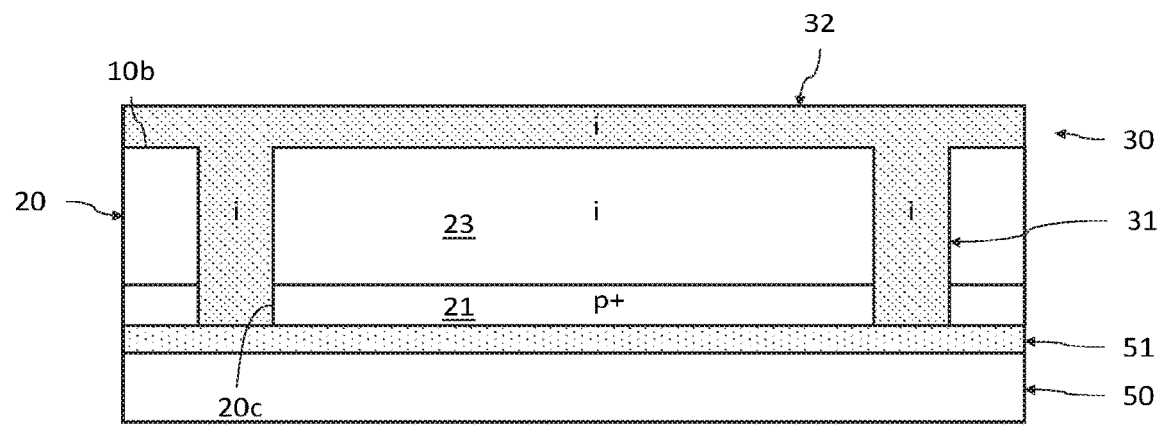
Figure 2F:
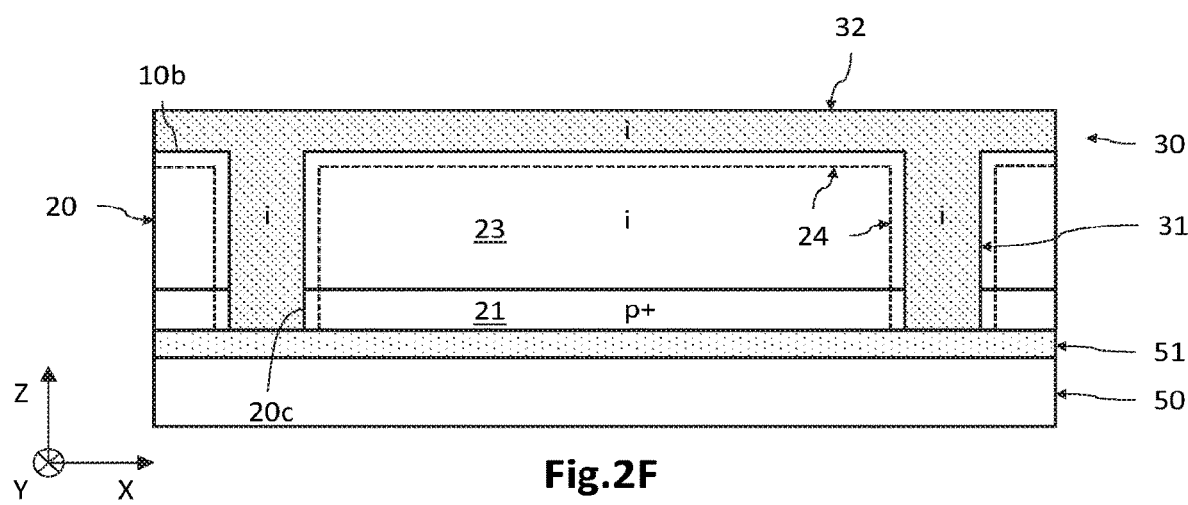
Figure 2G:
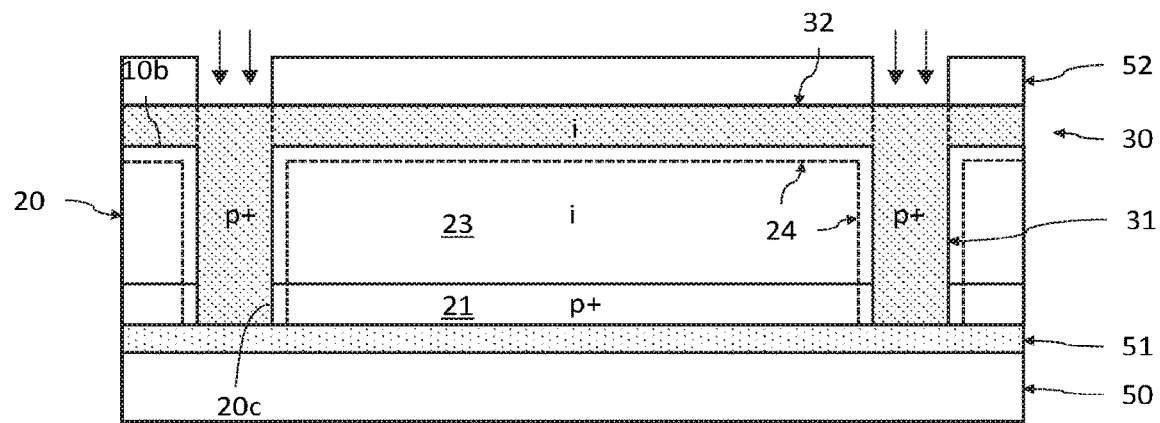
Figure 2H:
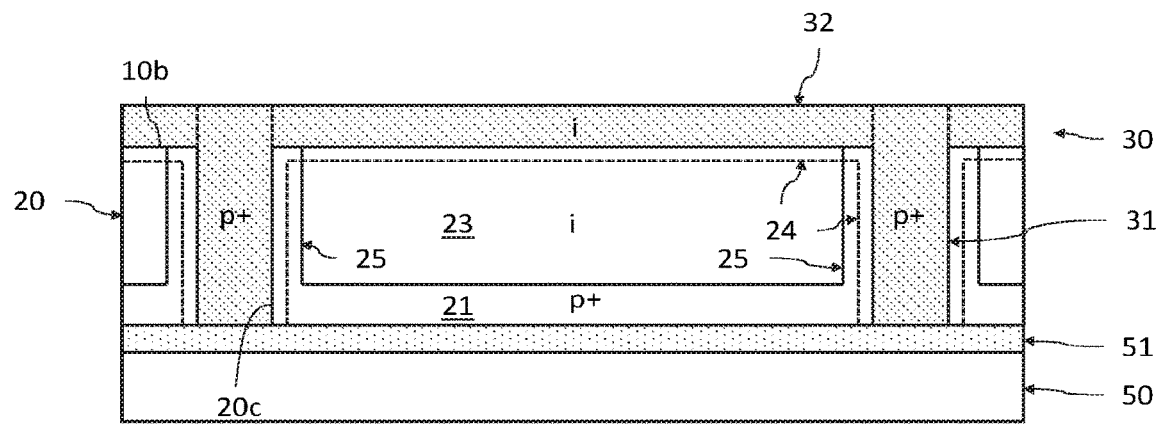
Figure 2I:
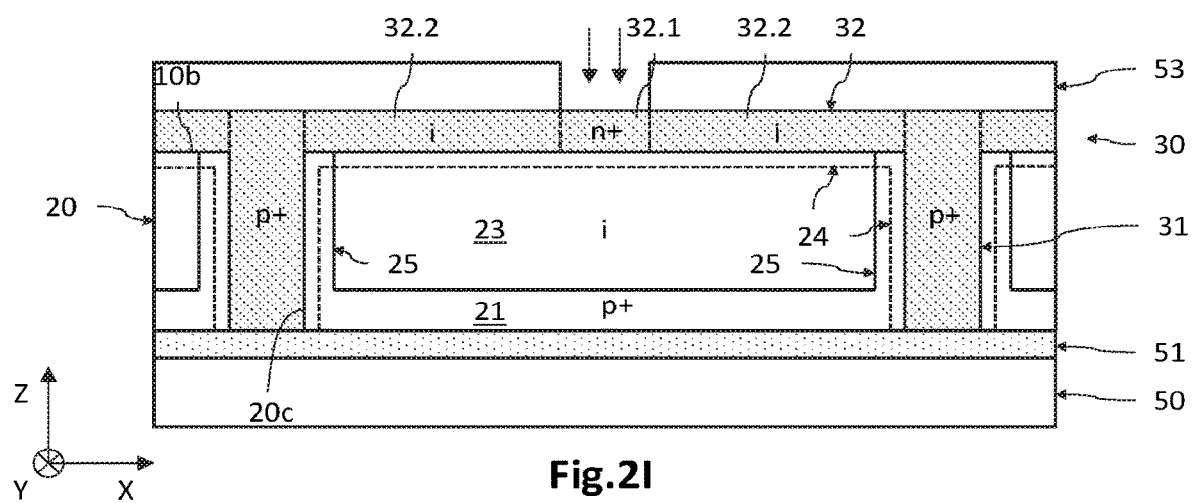
Figure 2J:
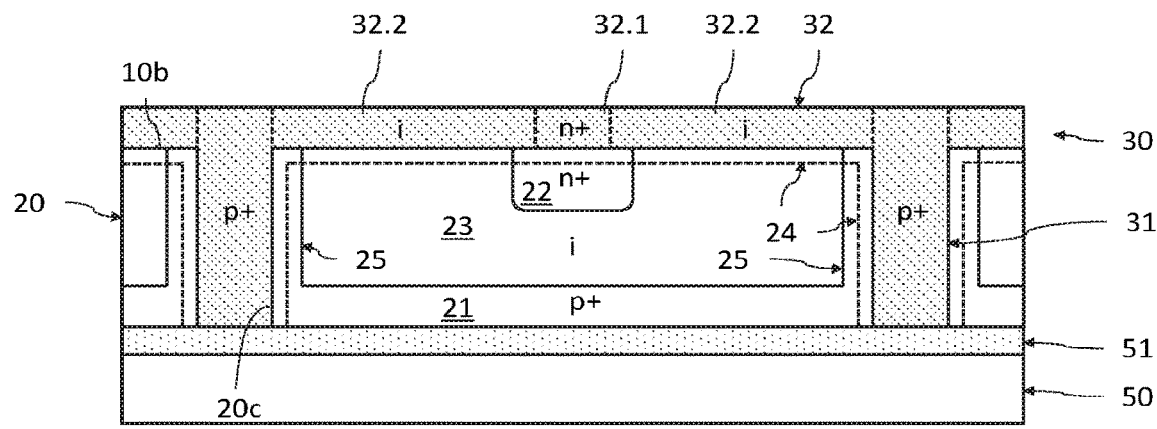
Figure 2K:
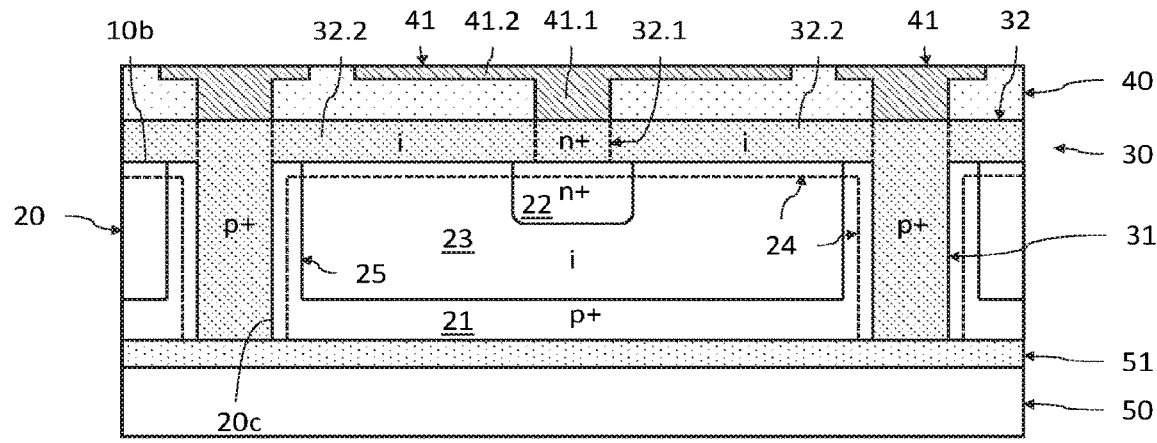
Figure 2L:
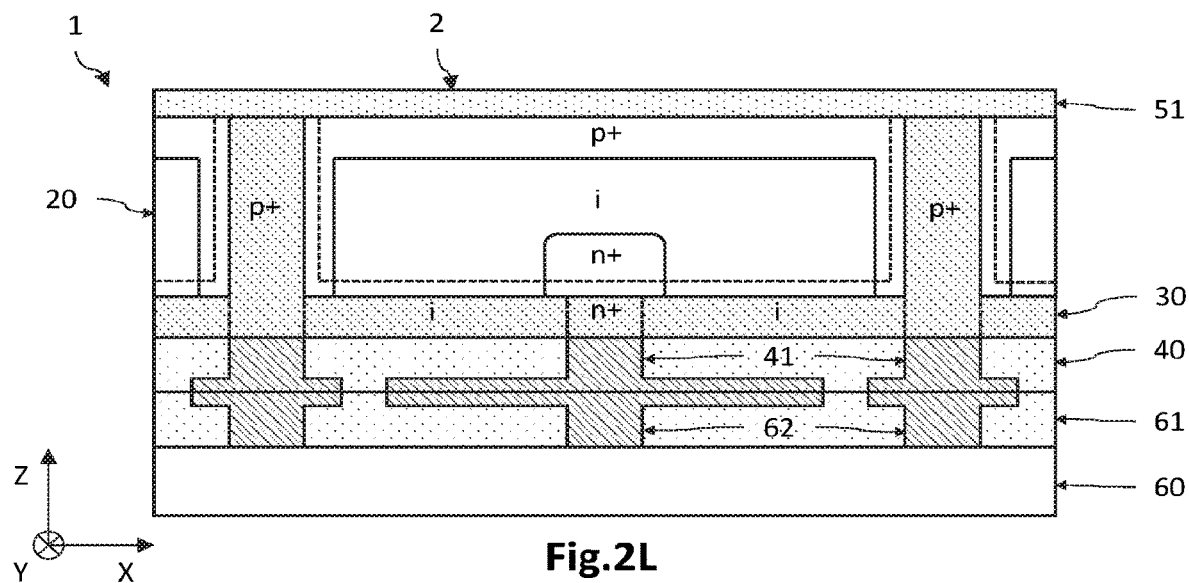

In the figures and in the remainder of the description, the same references represent identical or similar elements. Moreover, the various elements are not represented to scale so as to enhance the clarity of the figures. Furthermore, the various embodiments and variants are not mutually exclusive and may be combined with one another. Unless otherwise indicated, the terms "substantially", "approximately" and "of" the order of mean to within 10%, and preferably to within 5%.

The invention relates generally to a process for fabricating an optoelectronic device comprising an array of photodiodes made from germanium. Each photodiode is thus suitable for detecting light radiation in the short wavelength infrared (SWIR) corresponding to the spectral range extending from 0.8 nm to 1.7 μm approximately, or even to 2.5 μm approximately.

The photodiodes are said to be planar in so far as they extend along the same main plane, between first and second parallel faces that are opposite one another. They each comprise what is referred to as a semiconductor detection portion, within which a PN or PIN junction is present, having a substantially constant thickness between the first and second faces. Each photodiode comprises what is referred to as a p-doped lower first region flush with the first face continuously, what is referred to as an n-doped upper second region locally flush with the second face and forming a doped well, and an intermediate region located between the two doped regions and surrounding the doped second region in the main plane. This intermediate region may be p-doped, so as to form a PN junction, or be intrinsic, i.e. not intentionally doped, so as to form a PIN junction. The planar photodiodes do not then have a mesa structure, and are optically isolated from one another by trenches filled here with a part of a passivation semiconductor layer made from silicon. They thus have a particularly high fill factor. Furthermore, the photodiodes are said to be passivated in so far as the second face and also the lateral edge defined by the trenches are coated with the passivation semiconductor layer made from silicon. As described in detail below, the passivation semiconductor layer is notably intended to reduce the surface component of the dark current of each photodiode. It is advantageously used to apply an electric potential to the p+ doped first region from the second face.

Generally, the dark current of a photodiode is the electric current present within the photodiode during operation, when it is not subjected to light radiation. It may be formed of currents generated thermally within the volume of the semiconductor detection portion (diffusion currents, depletion currents, tunnel currents, etc.) and of surface currents.

The surface currents may be linked to the presence of electric charges in the passivation layer when it is made from a dielectric material, for example from a silicon oxide. Specifically, these electric charges may induce a modification of the bending of the energy bands close to the surface, leading to the formation of a depleted zone or of an inversion zone. The depleted zone, when it is located in the space charge zone of the photodiode, may give rise to unwanted generation-recombination currents. Moreover, the inversion zone, which is then electrically conductive, may allow electric charges to move between n-doped and p-doped biased regions situated at the interface with the passivation dielectric layer.

The surface currents may also be linked to the presence of defects in the semiconductor material of the photodiode, these defects notably being located close to surfaces of the semiconductor detection portion, in particular at the lateral edge and the second face. These defects may originate from the localized etching carried out in order to form the trenches, and also from the undesired incorporation of contaminants during technological steps of the fabrication process. These defects may be behind the creation of minority carriers in the absence of light radiation. These non-photogenerated minority carriers may then diffuse to the space charge zone of the photodiode and create an electric current, here a dark current.

The fabrication process according to one embodiment thus makes it possible to obtain an array of planar photodiodes made from germanium, that are passivated by a passivation semiconductor layer made from silicon and covering the second face and also the lateral edge in the trenches. At the interface with the passivation semiconductor layer, the semiconductor detection portion of each photodiode comprises what is referred to as a peripheral zone made from silicon-germanium. As described in detail below, such a peripheral zone has a higher concentration of silicon than that which the semiconductor detection portion may optionally have, so that it has a bandgap energy (gap) higher than that of the semiconductor detection portion. This peripheral "gap opening" is then located where the potential contaminants and surface defects are present, which makes it possible to limit the unwanted surface currents of the dark current.

Thus, the fabrication process makes it possible to obtain an array of planar photodiodes made from germanium with a high fill factor and a reduced dark current. As is described in detail below, the peripheral zone with gap opening is obtained without causing a substantial modification of the characteristics of the semiconductor detection portion, and more precisely without inducing a modification of the dimensions of the p-doped first region and advantageously of the n-doped second region.

For the sake of clarity, a photodiode of an array of germanium-based, planar and passivated photodiodes, obtained by the fabrication process according to one embodiment will firstly be illustrated.

FIG. 1 is a partial and schematic cross-sectional view of such a passivated planar photodiode 2 belonging to an array of photodiodes 2 made from germanium. Here they are biased, for example reverse-biased, from the second face 10b and are passivated and optically isolated from one another by a passivation semiconductor layer 30 extending over the second face 10b and filling the pixelation trenches 13.

A three-dimensional direct reference system (X,Y,Z) is defined here where the axes X and Y form a plane parallel to the main plane of the photodiodes 2, and where the axis Z is oriented along the thickness of the semiconductor detection portion 20 of the photodiode, from the first face 10a in the direction of the second face 10b. Furthermore, the terms "lower" and "upper" refer to an increasing position along the +Z direction.

Each photodiode 2 comprises a semiconductor detection portion 20 extending along the Z axis between a first and a second face 10a, 10b that are parallel to and opposite one another, and is delimited in the XY plane by a lateral edge 20C which connects the two faces together. The first and second faces 10a, 10b are common to each photodiode 2 of the array. They may be substantially planar, so that the semiconductor detection portion 20 has a substantially constant thickness along the Z axis, for example of between a few hundred nanometres and a few microns, for example of between 1 μM and 10 μm approximately. The thickness is chosen so as to obtain a good absorption in the wavelength range of the light radiation to be detected. The semiconductor detection portion 20 has a transverse dimension in the XY plane that may be between a few hundred nanometres and a few tens of microns, for example between 1 μm and 100 μm, preferably between 1 μm and 20 μm approximately.

The semiconductor detection portion 20 is made of a crystalline semiconductor material based on germanium, which is preferably monocrystalline. The expression "based on a chemical element of interest" is understood to mean that the crystalline semiconductor material corresponds to the chemical element of interest or is an alloy formed of at least the chemical element of interest. The photodiodes 2 may therefore be made of germanium Ge, silicon-germanium SiGe, germanium-tin GeSn, or silicon-germanium-tin SiGeSn. In this example, the semiconductor detection portion 20 is derived from at least one layer made of germanium. It may thus be a layer or a substrate made of the same germanium-based semiconductor material and have regions of different conductivity types (homojunction) so as to form a PN or PIN junction. As a variant, it may be a stack of sublayers of various germanium-based semiconductor materials (heterojunction), which are then formed from germanium. The semiconductor material of the semiconductor detection portion 20 has, outside of a peripheral zone 24 described below, a first concentration of silicon that may be zero or nonzero.

The semiconductor detection portion 20 is thus formed of a p-doped first region 21, which is flush with the first face 10a and extends in the XY plane from the lateral edge 20C, of an n-doped second region 22, which is locally flush with the second face 10b and forms an n-doped well located at a distance from the lateral edge 20C, and of an intermediate region 23 which is intrinsic (in the case of a PIN junction), or p-doped (in the case of a PN junction) located between and in contact with the two doped regions 21, 22 and surrounds the n-doped second region 22 in the main plane. The term "flush with" is understood to mean "reach the level of", or "extends from". In this example, the semiconductor junction is of PIN type, the first region 21 being p+-doped, the second region 22 being n+-doped and the intermediate region 23 is intrinsic (not intentionally doped).

The first region 21, here p+-doped, extends in the XY plane flush with the first face 10a, here from the lateral edge 20C. It extends along the Z axis from the first face 10a. It may have a substantially homogeneous thickness along the Z axis and thus be flush only with a lower zone of the lateral edge 20C. As a variant, as illustrated in FIG. 1, the p+-doped first region 21 may advantageously have a p+-doped lateral region 25 that is continuously flush with the lateral edge 20c along the Z axis and extends over the entire periphery of the semiconductor detection portion 20. The p+-doped first region 21 may have a doping that may be between $10^{18}$ and $10^{20}$ at/cm$^3$ approximately.

The n+-doped second region 22 extends here from the second face 10b and is surrounded by the intermediate region 23 in the main plane. It is at a distance from the lateral edge 20C of the semiconductor detection portion 20 in the XY plane. It thus forms an n-doped well that is flush with the second face 10b and is spaced a nonzero distance away with respect to the lateral edge 20C and also to the first face 10a.

The n-doped second region 22 thus contributes to delimiting the second face 10b. It may have a doping that may be between $10^{19}$ and $10^{21}$ at/cm$^3$ approximately.

The intermediate region 23 is located between the two n+-doped and p+-doped regions. It therefore surrounds the n+-doped second region 22 in the XY plane and is locally flush with the second face 10b. It is intrinsic so as to form a PIN junction but may be p-doped in order to form a PN junction.

The optoelectronic device 1 may comprise a lower insulating layer 51, made of a dielectric material, covering the first face 10a of the semiconductor detection portion 20, and also, as described below, the lower face of trenches 13 filled with a silicon-based passivation semiconductor material. The trench 13 may then contribute to electrically biasing the photodiode, here from the second face, and to pixelating the array of photodiodes 2 (optical isolation). The lower insulating layer 51 may further be suitable for forming an antireflection function with respect to the incident light radiation. Specifically, it forms the face for receiving the light radiation intended to be detected.

The semiconductor detection portion 20 of each photodiode 2 is delimited laterally, in the XY plane, by a preferably continuous trench 13, which extends here over the entire thickness of the semiconductor detection portion 20 to open onto the lower insulating layer 51. As a variant, the trench 13 may not open onto the lower insulating layer 51 and may end in the p+-doped first region 21. The trenches 13 may have transverse dimensions, in the XY plane, of the order of 0.5 μm to 2.0 μm.

A passivation semiconductor layer 30 continuously covers the second face 10b and entirely fills the trenches 13. It is thus in contact with the p+-doped first region 21 at the lateral edge 20C, with the intermediate region 23 at the lateral edge 20C and the second face 10b, and with the n+-doped second region 22 at the second face 10b. It is made of a silicon-based semiconductor material. It is thus formed of an upper part 32 in contact with the second face 10b and of a lateral part 31 filling the trench 13. The upper 32 and lateral 31 parts form two continuous joined zones of the same passivation semiconductor layer 30. This layer is made from silicon, and may be, for example, amorphous silicon, polycrystalline silicon, silicon-germanium. The passivation semiconductor layer 30 has a higher concentration of silicon than that of the germanium-based semiconductor material of the semiconductor detection portion 20. The upper part 32 may have a thickness, along the Z axis, for example of between 100 nm and 1 μm.

As mentioned above, the defects of the germanium-based semiconductor material may be present close to the lateral edge 20C and the second face 10b of the semiconductor detection portion 20. These defects may originate, as regards the lateral edge 20C, from the localized etching carried out in order to obtain the trenches 13. As regards the second face 10b, they may originate from contaminant elements unintentionally incorporated during technological steps carried out during the fabrication process. These defects and these contaminants may introduce an intermediate energy level into the bandgap energy of the germanium-based semiconductor material, which may then enable the spontaneous passage of a charge carrier from one energy band to another, thus creating an electron-hole pair and therefore a minority carrier. This minority carrier, when it diffuses to the space charge zone, may then contribute to the dark current.

Furthermore, a passivation layer made of a dielectric material may after all contribute to generating a surface contribution of the dark current. Specifically, as the above-mentioned article by Sood et al. 2011 indicates, a dielectric passivation layer may induce the formation of a depleted zone in the intermediate region 23 from the second face 10b. When this depleted zone is located in the space charge zone of the photodiode, it may then be the site of an unwanted generation-recombination current. Furthermore, the dielectric passivation layer may form an inversion zone, which is then electrically conductive, and which may therefore connect the n+-doped second region 22 to the lateral portion 31, here which is p+-doped.

Also, the passivation semiconductor layer 30, via an interdiffusion annealing (intermixing) carried out during the fabrication process, leads to the formation of a peripheral zone 24 based on silicon-germanium in each semiconductor detection portion 20, at the second face 10b and the lateral edge 20C. In this peripheral zone 24 (delimited by a dotted line in the figures), the concentration of silicon is higher than that which the semiconductor material of the semiconductor detection portion 20 may have. By way of example, the semiconductor detection portion 20 is here made of germanium, the passivation semiconductor layer 30 is made of silicon, and the peripheral zone 24 is made of silicon-germanium. However, owing to the higher concentration of silicon in the peripheral zone 24 than in the rest of the semiconductor detection portion 20, the gap therein is higher. Also, this high gap is located in the zones where the crystalline defects and the potential contaminants are located. The probability that a charge carrier can jump the gap spontaneously is then reduced. The passivation semiconductor layer 30 therefore makes it possible to reduce the unwanted surface currents and consequently to reduce the dark current. Furthermore, this gap opening also results in the formation of a potential barrier with respect to photogenerated minority carriers which would diffuse in the direction of the crystalline defects and contaminants located close to the lateral edge 20C and the second face 10b. Thus, photogenerated carriers are prevented from recombining without being detected and do not contribute to the electrical signal of use for detection. The performance of the photodiodes 2 is then improved.

Furthermore, as described below, the interdiffusion annealing does not result in a substantial modification of the dimensions of the p+-doped first region 21, in as far as the p-type dopant elements in the germanium (boron, gallium, etc.) have a reduced diffusion coefficient. Conversely, the n-type dopant elements in the germanium (phosphorus, arsenic, antimony, etc.) have a high diffusion coefficient, the interdiffusion annealing then advantageously being carried out before the step of producing the n+-doped second regions 22.

Furthermore, the semiconductor detection portion 20 advantageously comprises a p+-doped lateral region 25, located at the lateral edge 20C. This lateral region 25 has a higher doping level than that of the intermediate region 23 when it is doped. The p+-doped lateral region 25 is flush with the lateral edge 20C and is in contact with the p+-doped lateral part 31. As described below, it is obtained during the interdiffusion annealing, or during a specific diffusion annealing of the dopant elements. Thus, the biasing of the p+-doped first region 21 is improved in so far as the contact surface with the p+-doped lateral part 31 is increased. Furthermore, this p+-doped lateral region 25 makes it possible to prevent the space charge zone of the photodiode 2 from extending as far as the lateral edge 20C. Thus, the contribution of this zone (potentially not free of defects linked to the production of the trenches 13) to the dark current is limited. Thus the performance of the photodiode 2 is improved.

In this example, the optoelectronic device 1 further comprises an electrical circuit for biasing, for example for reverse-biasing, each photodiode 2. Also, the passivation semiconductor layer 30 comprises p+-doped lateral parts 31 that are flush with the substantially planar upper face of the passivation semiconductor layer 30, and also an n+-doped central portion 32.1 of the upper part 32, that is flush with the upper face and located in contact with the n+-doped second region 22. The electrical circuit is here suitable for biasing the photodiodes 2 from the second face 10b. The electrical circuit here comprises contact metallizations 41 extending through the through-openings of an upper insulating layer 40 which coats the passivation semiconductor layer 30, and coming into contact with the p+-doped lateral parts 31 on the one hand and with the n+-doped central portion 32.1 on the other hand. The contact metallizations 41 have here a lower part 41.1 that comes into contact with the doped zones 31, 32.1 of the passivation semiconductor layer 30, and an upper part 41.2 that is flush with the upper face and has dimensions in the XY plane larger than those of the lower part 41.1. The contact metallizations 41 here also act as a reflector with respect to the incident light radiation coming from the first face ma (this face acting as the optical receiving face). The absorbed proportion of the incident light radiation in the semiconductor detection portion 20 is thus improved.

Note that the passivation semiconductor layer 30 was obtained by depositing a silicon-based intrinsic semiconductor material. Also, the p+-doped lateral part 31 and the n+-doped central portion 32.1 are electrically insulated from one another by a peripheral portion 32.2 made from intrinsic silicon, and therefore having a high electrical resistivity, close to that of the dielectric materials, for example greater than $10^9$ Ω·cm. Also, any risk of short-circuiting between the p+-doped lateral part 31 and the n+-doped central portion 32.1, when they are biased, is thus eliminated.

One example of a process for fabricating an array of planar photodiodes 2 according to the embodiment illustrated in FIG. 1 is now described with reference to FIGS. 2A to 2L. In this example, the photodiodes 2 are made of germanium and comprise a PIN junction, and are suitable for detecting infrared radiation in the SWIR range. The photodiodes 2 are planar, and are passivated by a passivation semiconductor layer 30 which extends both in contact with the second face 10b and in contact with the lateral edge 20C in the trenches 13. This passivation semiconductor layer 30 advantageously makes it possible to ensure the biasing, for example reverse-biasing, of each photodiode 2 from the second face 10b.

During a first step (FIG. 2A), a first semiconductor layer 11 of monocrystalline germanium is produced. The first semiconductor layer 11 is firmly attached to a support layer 50, here made of silicon, by means of a lower insulating layer 51, here made of silicon oxide. This stack takes the form of a GeOI (Germanium On Insulator) substrate. This stack is preferably produced by means of the process described in the publication by Reboud et al. entitled 'Structural and optical properties of 200 mm germanium-on-insulator (GeOI) substrates for silicon photonics applications', Proc. SPIE 9367, Silicon Photonics X, 936714 (Feb. 27, 2015). Such a process has the advantage of producing a germanium semiconductor layer 11 having an absence or a low content of structural defects such as dislocations. The germanium may be not intentionally doped or be doped, for example p-doped. The semiconductor layer 11 may have a thickness of between 20 nm and 500 nm approximately, for example equal to 300 nm approximately, and may be covered with a protective layer (not represented) made of silicon oxide. The lower insulating layer 51 (BOX, for Buried Oxide) may have a thickness of between 50 nm and 1 μm and advantageously provides an antireflection function.

A p-doping of the germanium first layer 11 is then carried out, by ion implantation of a dopant such as boron or gallium, when the germanium is intrinsic. The protective layer, where applicable, was removed beforehand by surface cleaning and the germanium first layer 11 may be coated with a preimplantation oxide layer (not represented) having a thickness of a few tens of nanometres, for example equal to 20 nm. The germanium layer 11 then has a doping level of between $10^{18}$ and $10^{20}$ at/cm$^3$ approximately. Diffusion annealing of the dopant can then be carried out under nitrogen, for a few minutes to a few hours, for example 1 h, at a temperature that may be between 600° C. and 800° C., for example equal to 800° C. As a variant, the first layer 11 may be p+-doped with boron or gallium during the formation of the GeOI, in which case this doping step is not performed.

During a subsequent step (FIG. 2B), a second germanium semiconductor layer 12 is produced epitaxially from the first layer 11. The two layers 11, 12 are intended to form the coplanar germanium semiconductor detection portions 10 of the array of photodiodes 2. The second layer 12 is formed epitaxially, for example by chemical vapour deposition (CVD) or by any other epitaxial technique. This layer may undergo various annealings in order to reduce the level of dislocations. The preimplantation oxide layer, where applicable, was removed beforehand by surface cleaning. The germanium second layer 12 is intrinsic here, i.e. not intentionally doped. It is intended to form the light absorption zone of the photodiodes 2. Its thickness depends on the wavelength range of the light radiation to be detected in the case of a photodiode 2. In the context of SWIR photodiodes 2, the intrinsic germanium second layer 12 has a thickness for example of between 0.5 μm and 3 μm, preferably equal to 1.5 μm.

During a subsequent step (FIG. 2C), what is referred to as an upper part 32 of the passivation semiconductor layer 30 is deposited so as to continuously cover the upper face 10b of the second layer 12, i.e. so as to cover what will be the various semiconductor detection portions of the photodiodes 2. The risks of contamination or of oxidation of the surface of the germanium are thus reduced. The passivation semiconductor layer 30 is made from an intrinsic semiconductor material, and more specifically from silicon, for example amorphous silicon, polycrystalline silicon or silicon-germanium. The upper face 10b of the second layer 12 may have been cleaned. The upper part 32 of the passivation semiconductor layer 30 may have a thickness of between 3 nm and 500 nm. As a variant, it is possible to produce the trenches 13 before the deposition of the passivation semiconductor layer 30.

During a subsequent step (FIG. 2D), the trenches 13, intended to pixellate the photodiodes 2 and to contribute here to electrically biasing them, for example reverse-biasing them, are then produced by photolithography and etching. Thus a localized etching of the upper part 32 of the passivation semiconductor layer 30, of the intrinsic germanium second layer 12, and of the p+-doped germanium first layer 11 is carried out until ending up here on the lower insulating layer 51. Each trench 13 thus extends preferably continuously around a photodiode 2. Thus a plurality of semiconductor detection portions 20 that are separated from one another by a continuous trench 13 are obtained. Each semiconductor detection portion 20 is here formed of a p+-doped first region 21 and of an intermediate region 23 which here is intrinsic. The trenches 13 are preferably obtained by an anisotropic etching technique, so as to obtain a lateral edge 20c that is substantially vertical along the Z axis. The trenches 13 have a transverse dimension (width) in the XY plane that may be between 300 nm and 2 µm, for example equal to 1 µm. The semiconductor detection portions 20 may thus have a shape in the XY plane for example a circular, oval, polygonal, for example square, shape, or any other shape.

During a subsequent step (FIG. 2E), the lateral part 31 of the passivation semiconductor layer 30 is then produced. For this, a silicon-based intrinsic semiconductor material is deposited so as to completely fill the trenches 13. The semiconductor material is preferably identical to that of the upper part 32 of the passivation semiconductor layer 30, namely amorphous silicon, polycrystalline silicon or silicon-germanium. Thus, a passivation semiconductor layer 30 made from intrinsic silicon is obtained, of which the upper part 32 extends in contact with the second face 10b and the lateral part 31 fills the trench 13 and extends in contact with the lateral edge 20C. The lateral 31 and upper 32 parts are two parts of the same continuous semiconductor layer. A step of chemical mechanical polishing (CMP) may then be carried out, in order to planarize the upper face of the passivation semiconductor layer 30.

As a variant, the lateral 31 and upper 32 parts of the passivation semiconductor layer 30 may be obtained simultaneously, by deposition of a silicon-based intrinsic semiconductor material so as to extend in contact with the second face 10b and to fill the trench 13.

During a subsequent step (FIG. 2F), an annealing is carried out that ensures the interdiffusion between the silicon of the passivation semiconductor layer 30 and the germanium of the semiconductor detection portion 20. A peripheral zone 24 made from silicon-germanium is thus obtained, which is located in the semiconductor detection portion 20 at the interface with the passivation semiconductor layer 30. It is therefore flush with the second face 10b and the lateral edge 20C in a continuous manner. This peripheral zone 24 then has a higher concentration of silicon than the concentration of silicon that the semiconductor detection portion 20 may have outside of this zone. The interdiffusion annealing may be carried out at a temperature for example of the order of 700° C. to 850° C. for a time of the order of 30 minutes to 10 hours.

In so far as the gap of a semiconductor material based on germanium or on silicon-germanium increases with the concentration of silicon, the peripheral zone 24 has a higher gap than that of the semiconductor detection portion 20 outside of this zone 24. This peripheral zone 24 with a "gap opening" thus makes it possible to effectively passivate the semiconductor detection portion 20 and to reduce the surface component of the dark current associated with the presence of unwanted contaminants and/or crystalline defects. It also forms a potential barrier that makes it possible to reduce the risk of a photogenerated minority carrier recombining in this peripheral zone 24 without being detected by the photodiode 2.

During a subsequent step (FIG. 2G), an ion implantation of p-type dopant elements, for example boron, into the lateral part 31 of the passivation semiconductor layer 30 is carried out so as to obtain a lateral part 31 that is p+-doped over the entire thickness thereof, with a doping level for example of between $10^{19}$ and $10^{21}$ at/cm$^3$. The ion implantation is carried out in a localized manner through a through-opening made in a photoresist 52. The photoresist is then removed. Thus, the passivation semiconductor layer 30 has a p+-doped lateral part 31 which is flush with the upper face of the passivation semiconductor layer 30, and an intrinsic upper part 32.

During a subsequent step (FIG. 2H), an annealing that ensures the diffusion of the p-type dopant elements (boron) from the p+-doped lateral part 31 to the semiconductor detection portion 20 via the lateral edge 20C is advantageously carried out. A p+-doped lateral region 25 is thus obtained that extends into the semiconductor detection portion 20 along the Z axis at the lateral edge 20C. The diffusion annealing of the p dopants may be carried out at a temperature for example of between 700° C. and 850° C., for a time for example of between 10 min and 5 h. As a variant, the interdiffusion annealing and the diffusion annealing may be one and the same annealing carried out after p-type doping of the lateral part 31 of the passivation semiconductor layer 30.

During a subsequent step (FIGS. 2I and 2J), the n+-doped second region 22 of the semiconductor detection portion 20 is then produced, here in two stages. Firstly (FIG. 2I), an ion implantation zone for implanting n-type dopants, for example phosphorus, arsenic or antimony, by means of a through-opening of a photoresist 53 (FIG. 2I) is defined. The through-opening is located opposite a central zone of the photodiode 2, and has dimensions in the XY plane corresponding to the desired dimensions of the n+-doped second region 22. They may be, for example, between 300 nm and 90 µm. An ion implantation of a dopant such as phosphorus is carried out through the opening of the photoresist 53, in an initially intrinsic central portion 32.1 of the passivation semiconductor layer 30, in order to make it n+-doped. The photoresist 53 may then be removed. Next, (FIG. 2J), at least one annealing that ensures the diffusion of the n dopant elements from the n+-doped central portion 32.1 of the passivation semiconductor layer 30 to the semiconductor detection portion 20 is carried out, for example at a first temperature of 800° C. for 5 min and then at a second temperature of between 600° C. and 700° C. for 5 s to 60 s. The n+-doped second region 22 is thus obtained. By this two-stage step of producing the n+-doped second region 22, the defects linked to an ion implantation of n-type dopant elements directly into the semiconductor detection portion 20 are thus limited.

The n+-doped second region 22 thus forms a doped well delimited in the XY plane and along the −Z direction by the intrinsic germanium intermediate region 23. It is preferably excessively n+-doped and may thus have a doping level of the order of $10^{19}$ at/cm$^3$. By way of example, it is possible to have a doping in the central portion 32.1 of the order of $10^{21}$ at/cm$^3$ at the interface with the layer 40, and of the order of $10^{19}$ at/cm$^3$ at the interface with the region 22, then the doping in the region 22 decreases from $10^{19}$ at/cm$^3$ to a value of the order of $10^{14}$ at/cm$^3$ in the intrinsic region 23. Owing to the fact that the interdiffusion annealing of the silicon and germanium and also the diffusion annealing of the p-type dopant elements are carried out before the production of the n+-doped second region 22, this region has controlled dimensions. Specifically, the n-type dopant elements in the germanium (phosphorus, arsenic, etc.) have a high diffusion coefficient, greater than that of the p-type dopant elements (boron, gallium, etc.). Also, the dimensions of the p+-doped lateral region 25 are not substantially changed or are barely changed, and the dimensions of the n+-doped second region 22 correspond to the desired dimensions.

Thus, an n+-doped second region 22 is thus obtained within the semiconductor detection portion 20, surrounded by the intrinsic germanium intermediate region 23 in the XY plane. The passivation semiconductor layer 30 comprises a p+-doped lateral part 31 which is in contact with the p+-doped first region 21 and with the p+-doped lateral region 25; an upper part 32 formed of an n+-doped central portion 32.1 in contact with the n+-doped second region 22; and an intrinsic peripheral portion 32.2 which surrounds the n+-doped central portion 32.1 and physically and electrically separates this portion from the p+-doped lateral part 31. The n+-doped central portion 32.1 and the p+-doped lateral part 31 are flush with the upper face of the passivation semiconductor layer 30.

During a subsequent step (FIG. 2K), an electrical interconnection layer is then produced. For this, an upper insulating layer 40 is deposited so as to continuously cover the passivation semiconductor layer 30. It may be made from a dielectric material, for example a silicon oxide, nitride or oxynitride, an aluminium oxide or nitride, a hafnium oxide, inter alia. The upper insulating layer 40 may have a thickness for example of between 10 nm and 500 nm. Annealing under $N_2H_2$ (e.g. 90% $N_2$ and 10% $H_2$) may be carried out at a temperature of the order of 400° C. to 450° C. to passivate the pendant bonds at the Si/Ge interface.

Finally, contact metallizations 41 are produced, that extend through the upper insulating layer 40, and come into contact with the n+-doped central portion 32.1 on the one hand, and with the p+-doped lateral part 31 on the other hand. The intrinsic peripheral portion 32.2 of the passivation semiconductor layer 30 is not in contact with a contact metallization. The contact metallizations 41 may be produced in a conventional manner, by filling openings that pass through the upper insulating layer 40 with at least one metal material (barrier layer based on Ti, copper core), followed by a step of CMP planarization. Each contact metallization 41 may have a lower part 41.1 in contact with the passivation semiconductor layer 30, and an upper part 41.2 flush with the upper face of the upper insulating layer 40. The upper part 41.2 advantageously has transverse dimensions, in the XY plane, greater than those of the lower part 41.1, and thus provides an additional function of reflecting the light radiation received through the first face 10a, this forming the face for receiving the light radiation to be detected.

During a subsequent step (FIG. 2L), the optoelectronic stack thus obtained is hybridized on a control chip 60. The connection face of the control chip 60 may thus be coated with an insulating layer 61, made of a dielectric material, through which contact metallizations 62 pass. The optoelectronic stack and the control chip 60 are thus assembled by hybrid molecular adhesion, through contact between the faces formed by the contact metallizations 41, 62 and the insulating layers 40, 61. A bonding annealing may be carried out so as to increase the surface bonding energy between the two faces in contact.

The support layer 50 is then removed, for example by abrasion (grinding), so as to expose the lower insulating layer 51. This thus forms the face for receiving the light radiation to be detected, and advantageously provides an antireflection function.

The fabrication process thus makes it possible to obtain an array of planar photodiodes 2 made from germanium, of which the lateral edge 20C and the second face 10b are passivated by a passivation semiconductor layer 30 made from silicon. The peripheral zone 24 based on silicon-germanium which is thus formed makes it possible to limit the surface components of the dark current.

Furthermore, in so far as the n+-doped second region 22 is formed by diffusion of dopants from an n+-doped central portion 32.1 of the passivation semiconductor layer 30, this being after the interdiffusion annealing of the silicon and germanium, and after the optional diffusion annealing of the p-type dopants from the p+-doped lateral part 31, the fabrication process makes it possible to preserve the dimensions of the n+-doped second region 22. Thus, any risk of short-circuiting of the photodiodes 2 by excessive modification of the dimensions of the doped second regions 22 is thus eliminated.

Furthermore, the performance of the photodiodes 2 is also notably improved by the following features: the p-doped lateral regions 25 located at the lateral edge 20C, the wide upper parts 41.2 of the contact metallizations 41, the doped second regions 22 obtained by diffusion of dopants and not by ion implantation directly into the semiconductor detection portion 20.

Particular embodiments have just been described. Various variants and modifications will be apparent to a person skilled in the art. Thus, as mentioned previously, the lateral part 31 of the passivation semiconductor layer 30 may not be p-doped. The p-doped first region 21 may then be biased using an electrical contact located at the first face 10a.

The invention claimed is:

1. A process for fabricating an optoelectronic device comprising an array of planar photodiodes made from germanium, comprising the following steps:
   i) producing a stack of semiconductor layers, made from germanium, having a first face and a second face that are opposite one another and are parallel to a main plane of the photodiodes, and comprising:
      a p-doped first layer, defining the first face, and
      a second layer, covering the first layer, and defining the second face;
   ii) producing trenches, extending through said stack from the second face in the direction of the first face, defining for each photodiode a semiconductor portion of said stack;
   iii) depositing a passivation intrinsic semiconductor layer, made from silicon, covering the second face and filling the trenches; and
   iv) annealing, ensuring, for each photodiode, an interdiffusion of the silicon of the passivation semiconductor layer and of the germanium of the semiconductor portion, thus forming a peripheral zone of the semiconductor portion, made from silicon-germanium, and located in contact with the passivation semiconductor layer.

2. The process according to claim 1, comprising, following the interdiffusion annealing step, a step of producing, for each photodiode, an n-doped upper region of the semiconductor portion, flush with the second face and located at a distance from a lateral edge of the semiconductor portion connecting the first and second faces to one another, via the following substeps:
   localized ion implantation of n-type dopant elements in a central portion of the passivation semiconductor layer, and
   annealing, ensuring a diffusion of the n-type dopant elements from the central portion to the semiconductor portion, thus forming the n-doped upper region.

3. The process according to claim 2, comprising a step of doping what are referred to as lateral parts of the passivation semiconductor layer, that are located in the trenches, by localized ion implantation of p-type dopant elements, thus forming, for each photodiode, a p-doped lateral part, followed by a step of annealing ensuring the diffusion of the p-type dopant elements from the lateral parts to the semiconductor portions, thus forming, in each semiconductor portion, a p-doped lateral region flush with a lateral edge of the semiconductor portion.

4. The process according to claim 3, wherein the step of diffusion annealing of the p-type dopant elements is carried out before or during the step of diffusion annealing of the n-type dopant elements.

5. The process according to claim 1, comprising a step of producing an electrical interconnection layer, comprising:
depositing an upper insulating layer made of a dielectric material, covering the passivation semiconductor layer, then
forming, through the upper insulating layer, conductive portions, that come into contact, for each photodiode, with a p-doped lateral part of the passivation semiconductor layer located in a trench on the one hand, and with an n-doped central portion of the passivation semiconductor layer located on the second face and in contact with what is referred to as an n-doped upper region of the semiconductor portion.

6. The process according to claim 1, comprising forming a doped region in the passivation intrinsic semiconductor layer configured to provide a connection between an electrode and the second layer.

7. The process according to claim 6, comprising forming a doped region of higher concentration than a concentration of dopants in the second layer connected to the doped region in the passivation semiconductor layer.

8. The process according to claim 1, comprising doping the passivation layer in the trenches to form a doped region configured to provide a connection to an electrode.

9. The process according to claim 1, comprising:
forming the passivation layer in contact with the second face.

10. The process according to claim 9, comprising:
forming a first region in the passivation layer having a dopant; and
diffusing the dopant from the first region into the second layer to form a doped region in the second layer.

11. The process according to claim 9, comprising:
forming a first region in the passivation semiconductor layer having a first dopant of a first conductivity type opposing the second face; and
forming second regions in the passivation semiconductor layer having a second dopant of a second conductivity type opposite to the first conductivity type each opposing a trench,
wherein the first region is disposed between adjacent ones of the second regions and separated from the second regions by a portion of the passivation semiconductor layer not having the first and second dopants.

12. The process according to claim 9, wherein forming the peripheral zone comprises:
diffusing silicon from the passivation semiconductor layer formed over the second face into the second face to form a first part of the peripheral zone; and
diffusing silicon from the passivation semiconductor layer in the trenches into sides of the second layer to form a doped region in the second layer to form a second part of the peripheral zone connect to the first part.

* * * * *